(12) United States Patent
Herr et al.

(10) Patent No.: US 7,772,871 B2
(45) Date of Patent: Aug. 10, 2010

(54) METHOD AND APPARATUS FOR HIGH DENSITY SUPERCONDUCTOR CIRCUIT

(75) Inventors: Quentin P. Herr, Ellicott City, MD (US); James E. Baumgardner, Odenton, MD (US); Aaron A. Pesetski, Gambrills, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 50 days.

(21) Appl. No.: 12/111,035

(22) Filed: Apr. 28, 2008

(65) Prior Publication Data

US 2009/0267635 A1 Oct. 29, 2009

(51) Int. Cl.
*H03K 19/195* (2006.01)
(52) U.S. Cl. .......................................... 326/4; 327/367
(58) Field of Classification Search ................. 326/1–7; 327/366–373
See application file for complete search history.

(56) References Cited

U.S. PATENT DOCUMENTS

| | | | |
|---|---|---|---|
| 4,117,354 A | 9/1978 | Geewala | |
| 4,916,335 A | 4/1990 | Goto et al. | |
| 5,099,152 A | 3/1992 | Suzuki | |
| 5,309,038 A | 5/1994 | Harada et al. | |
| 5,552,735 A * | 9/1996 | Kang et al. | 327/367 |
| 5,818,313 A * | 10/1998 | Estes et al. | 333/202 |
| 5,982,219 A * | 11/1999 | Kirichenko | 327/367 |
| 6,188,236 B1 | 2/2001 | Wikborg | |
| 6,507,234 B1 | 1/2003 | Johnson et al. | |
| 6,518,786 B2 | 2/2003 | Herr | |
| 6,549,059 B1 | 4/2003 | Johnson | |
| 6,724,216 B2 | 4/2004 | Suzuki et al. | |
| 6,750,794 B1 | 6/2004 | Durand et al. | |
| 6,865,639 B2 | 3/2005 | Herr | |
| 6,960,780 B2 | 11/2005 | Blais et al. | |
| 7,498,832 B2 | 3/2009 | Baumgardner et al. | |
| 2002/0063643 A1 | 5/2002 | Smith et al. | |
| 2002/0190381 A1 | 12/2002 | Herr et al. | |
| 2003/0011398 A1 | 1/2003 | Herr | |
| 2003/0016069 A1 | 1/2003 | Furuta et al. | |

(Continued)

FOREIGN PATENT DOCUMENTS

EP 0467104 1/1992

(Continued)

OTHER PUBLICATIONS

PCT/US2008/072017 ISR, Aug. 2008, WIPO/PCT ISR.

(Continued)

*Primary Examiner*—Rexford N Barnie
*Assistant Examiner*—Jany Tran
(74) *Attorney, Agent, or Firm*—Tarolli, Sundheim, Covell & Tummino LLP

(57) ABSTRACT

The disclosure relates to a method for providing a logic circuit element. The method includes arranging a series of Josephson junctions between a first Josephson junction and a second Josephson junction, the first Josephson junction having a first critical current ($I_{c1}$) and the second Josephson junction having a second critical current ($I_{c2}$); providing a working current to the first Josephson junction, the working current transmitting to the second Josephson junction through the series of the Josephson junctions; wherein the working current is sufficiently high to trigger the second Josephson junction while sufficiently low to not disturb super-conductivity of the series of intermediate Josephson junctions.

20 Claims, 7 Drawing Sheets

U.S. PATENT DOCUMENTS

| | | |
|---|---|---|
| 2003/0039138 A1 | 2/2003 | Herr |
| 2003/0040440 A1 | 2/2003 | Wire et al. |
| 2003/0115401 A1 | 6/2003 | Herr |
| 2003/0183935 A1 | 10/2003 | Herr et al. |
| 2004/0120444 A1 | 6/2004 | Herr |
| 2004/0201099 A1 | 10/2004 | Herr |
| 2004/0201400 A1 | 10/2004 | Herr |
| 2005/0001209 A1 | 1/2005 | Hilton et al. |
| 2005/0023518 A1 | 2/2005 | Herr |
| 2005/0082519 A1* | 4/2005 | Amin et al. .................. 257/13 |
| 2005/0110106 A1 | 5/2005 | Goto et al. |
| 2005/0224784 A1 | 10/2005 | Amin et al. |

FOREIGN PATENT DOCUMENTS

| | | |
|---|---|---|
| WO | WO 2005/093649 | 10/2005 |

OTHER PUBLICATIONS

Berns et al., "Coherent Quasiclassical Dynamics of a Persistent Current Qubit", *Physical Review Letters APS USA*, vol. 97, No. 15, pp. 150502, Oct. 13, 2006.

Garanin et al., Effects of nonlinear sweep in the Landau-Zener-Stueckelberg effect, *Physical Review B*, vol. 66, No. 17, pp. 174438-1-174438-11, Nov. 1, 2002.

Wulf et al., Dressed States of Josephson Phase Qubit Coupled to an LC Circuit, *IEEE Transaction on Applied Superconductivity IEEE USA*, vol. 15, No. 2, pp. 856-859, Jun. 2, 2005.

A NRZ—Output Amplifier for RSFQ Circuits, Koch et al., IEEE Transaction on Applied Superconductivity, vol. 9, No. 2, pp. 3549-3552, Jun. 1999.

U.S. Appl. No. 11/654,632, filed Jan. 2007, Herr.

Experimental Analysis of a New Generation of Compact Josephson-Inductance-Based RSFQ Circuits, Ortlepp et al., *11th International Superconductive Electronics Conference*, 3 pages, Jun. 10, 2007.

* cited by examiner

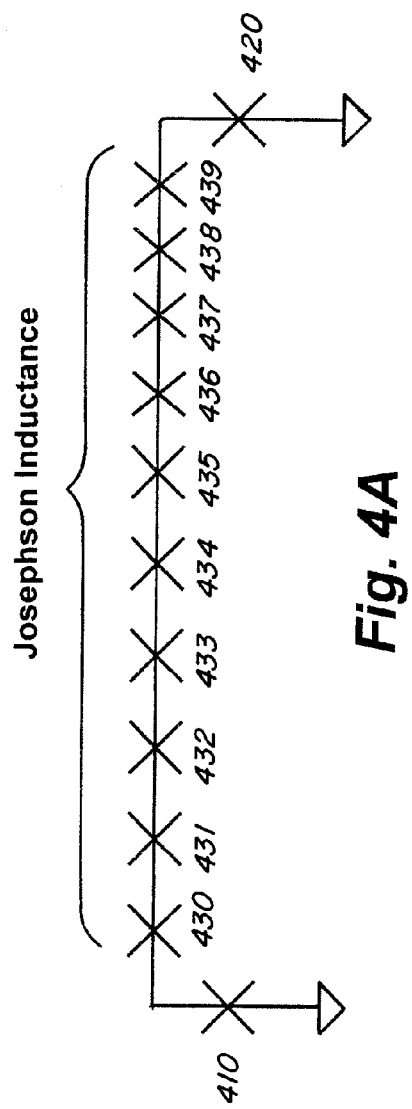
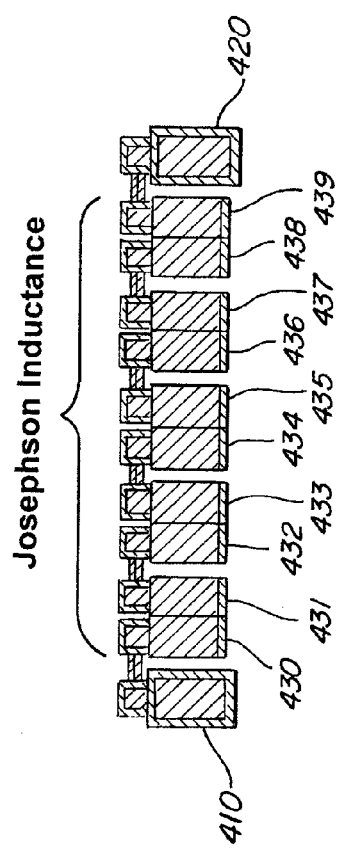

METHOD AND APPARATUS FOR HIGH DENSITY SUPERCONDUCTOR CIRCUIT

BACKGROUND

1. Field of the Invention

The disclosure generally relates to a method and apparatus for devising a high density superconductor. More specifically, the disclosure relates to a method and apparatus for reducing inductor footprint in a superconducting circuit while increasing inductance.

2. Description of Related Art

With recent developments in superconductor technology, superconductor devices using the Josephson junction effect are replacing conventional devices based on semiconductor technology for high performance and low power. Digital circuits that employ superconductor technology are often desirable because such devices can consume very little power while operating at very high clock speeds as compared with their semiconductor counterparts. Because of low power consumption, it is possible to make systems very compact. Other benefits for signal transmission using superconducting devices include reduced signal attenuation and noise. Digital circuits that employ superconductor devices can operate at clock speeds exceeding 100 GHz.

A Josephson junction is a weak link between two superconducting materials where carriers tunnel across the junction. As long as the current through the junction is less than a critical current ($I_c$), the junction will be superconducting. A bias current is applied to the junction that is below the critical current. When additional current, for example, from an analog signal, is applied to the junction so that the current exceeds the critical current, the junction will generate a voltage pulse. The voltage pulse corresponds to a quantum leap in the magnetic phase of the junction, which will create a single flux quantum (SFQ) voltage pulse across the junction. The area of the SFQ voltage pulse generated at the junction is determined by fundamental physical constants and is $\Phi_0 = h/2e$, where h is the Planks constant ($6.6262 \times 10^{-34}$ Joule seconds), and e is the fundamental electrical charge ($1.602 \times 10^{-19}$ Coulombs).

The SFQ pulses can be used to transmit data at very high frequencies. The SFQ pulses are transmitted by coupling a series of Josephson junctions together to provide a Josephson transmission line (JTL). When a particular Josephson junction in a JTL receives an SFQ pulse from a preceding Josephson junction, the pulse causes the junction to emit a voltage pulse, such that the SFQ pulse is recreated to continue propagating along the JTL. A discussion of JTLs operating in this manner can be found in U.S. Pat. No. 6,507,234, issued Jan. 14, 2003 to Johnson et al., assigned to the Assignee of this application, and herein incorporated by reference for background information.

JTL serves as interconnect for Josephson logic gates. Both JTL and logic gates use inductive interconnects. At lower temperature, lower power can be achieved with reduced Josephson junction critical current, which requires proportional increase in inductance of interconnect. The conventional inductive element is a strip. According to the conventional methods increasing inductance requires extending the length of the inductor. A bigger inductor requires a larger footprint on the micro circuit which is defeating to the concept of using Josephson junctions to miniaturize the circuit. Thus, there is a need for method and apparatus for high density superconductor inductive element with relatively smaller footprint.

SUMMARY

In one embodiment, the disclosure relates a single flux quantum digital logic circuit comprising: a first Josephson junction having a first critical current ($I_{c1}$); a second Josephson junction having a second critical current ($I_{c2}$); a series of intermediate Josephson junctions interposed between the first Josephson junction and the second Josephson junction, the series of intermediate Josephson junctions converting the voltage pulse from the first Josephson junction into a working current and directing the working current to the second Josephson junction; wherein the working current is sufficiently high to trigger the second Josephson junction while sufficiently low to not disturb super-conductivity of the series of intermediate Josephson junctions.

More generally, the disclosure relates a method for providing an inductive logic circuit element, the method comprising: arranging one or more Josephson junctions in series, wherein the working current applied to the inductive element is sufficiently high to create a desirable inductive flux in the series of intermediate Josephson junctions.

In still another embodiment, the disclosure relates to a method for conducting a logic circuit, the method comprising: arranging a series of Josephson junctions between a first Josephson junction and a second Josephson junction, the first Josephson junction having a first critical current ($I_{c1}$) and the second Josephson junction having a second critical current ($I_{c2}$); providing a working current to the first Josephson junction, the working current transmitting to the second Josephson junction through the series of the Josephson junctions; wherein the working current is sufficiently high to create a desirable signal at the second Josephson junction while sufficiently low to not disturb super-conductivity of the series of intermediate Josephson junctions.

BRIEF DESCRIPTION OF THE DRAWINGS

The representative embodiments of the disclosure will be described in relation with the following exemplary and non-limiting drawings in which:

FIG. 4A is a circuit schematic for the JTL loop according to an embodiment of the disclosure;

FIG. 4B shows the JTL loop physical layout (magnified) according to an embodiment of the disclosure;

DETAILED DESCRIPTION

As stated, the Josephson effect is the phenomenon of current flow across two weakly coupled superconductors, separated by a very thin insulating barrier. In this arrangement, the two superconductors linked by a non-conducting barrier define the Josephson junction and the current that crosses the barrier is the Josephson current.

Figure 1:
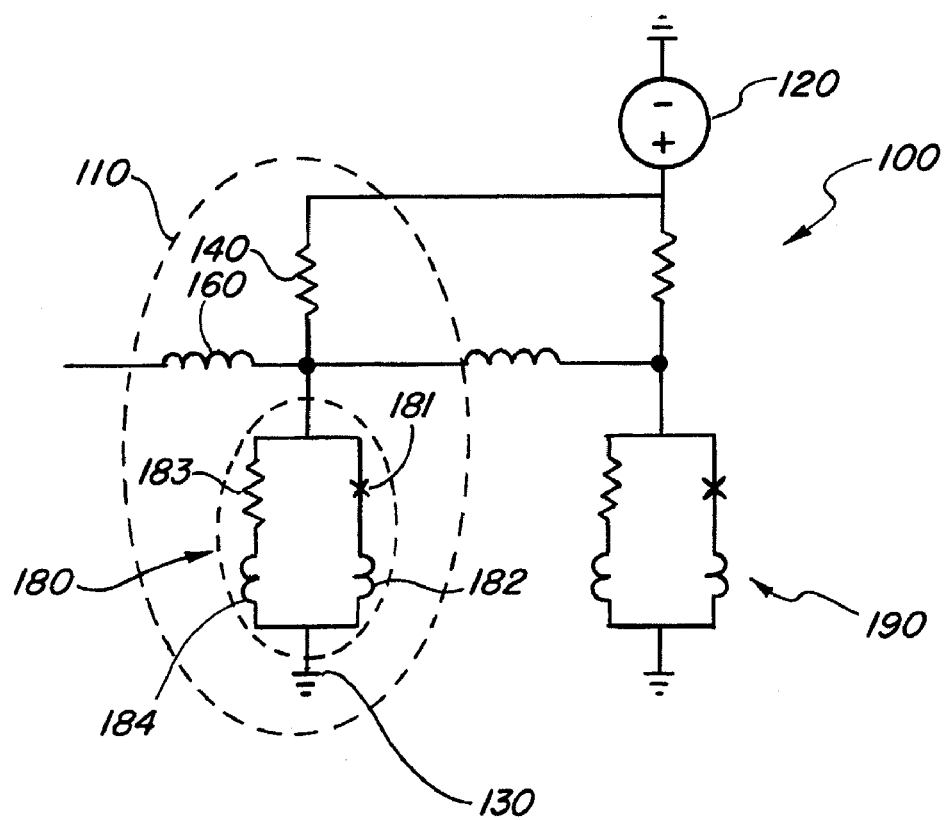
FIG. 1 is a circuit diagram for a conventional superconducting Josephson Transmission Line.

FIG. 1A is a circuit diagram for an inductive loop of a conventional superconducting JTL. The circuit of FIG. 1A comprises Josephson junctions 110 and 120 connected through inductive line 130. Each of Josephson junctions 110 and 120 is rated at a critical current of 100 µA and inductor 130 provides inductance of about 20 pH. The conventional JTLs also include a shunt resistor is placed in parallel with each of Josephson junctions 110 and 120. Finally, a bias current (not shown) must also be applied to the Josephson junctions.

The Josephson junction circuits 180 and 190 of the JTL 100 are spaced apart at predetermined intervals along the JTL 100 to regenerate the SFQ pulses at each stage. Each Josephson junction circuit 180 and 200 is shown as an equivalent circuit of a resistor and Josephson junction in a parallel array. The equivalent elements of the JTL segment 110 and the Josephson junction circuit 180 will be described with the understanding that all of the Josephson junction circuits in the JTL 100 have substantially the same elements. The Josephson junction circuit 180 includes a Josephson junction 181 that is connected in series with a first parasitic inductor 182. The Josephson junction 181 and the first parasitic inductor 182 are connected in parallel with a damping resistor 183 and a second parasitic inductor 184. The first and second parasitic inductors 182 and 184 are connected to a reference ground 130 opposite the Josephson junction 181 and the damping resistor 183. The damping resistor 183 shunts the Josephson junction 181 and helps define its response to incoming signals. The damping resistor 183 is chosen such that the so-called Stewart-McCumber parameter, which dictates how a Josephson junction is damped, falls between 1 and 2.

When operated at very high clock frequencies, timing between clock pulses and data pulses is critical. For example, in a digital circuit is operated at a 100 GHz clock, any given data pulse must arrive at its destination logic gate within a time interval of less than ten picoseconds in order to be correctly processed by that gate. Because of their high frequency, clock and data pulses arriving at any particular circuit element must be closely synchronized or errors will occur. The timing uncertainty of the SFQ pulses discussed above increases the need for greater timing synchronization. Therefore, superconductor circuits typically operate well below their potential speed so that the pulse timing uncertainty is less important.

Figure 2A:
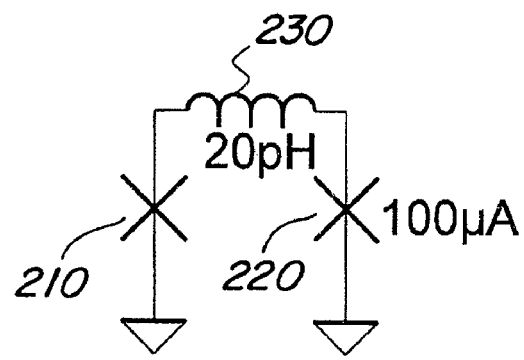
FIG. 2A is a circuit schematic for the inductive loop of a conventional superconducting Josephson transmission line using a typical parameter value.
Figure 2B:
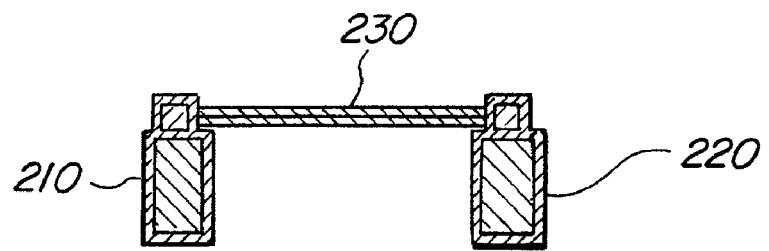
FIG. 2B shows physical layout (magnified) of the inductive loop of a conventional JTL.

FIG. 2A is a circuit schematic for the inductive loop of a conventional superconducting Josephson transmission line (JTL), using typical parameter values. More specifically, FIG. 2A shows a conventional SFQ digital logic circuit element. The SFQ logic circuit of FIG. 2A includes Josephson junctions 210 and 220 separated by controlled inductance 230. The SFQ logic circuit of FIG. 2A can define a superconducting quantum interference device ("SQUID"). FIG. 2B shows physical layout (magnified) of the inductive loop of a conventional JTL. As shown in FIG. 2B, Josephson junctions 210 and 220 have a critical current of about 100 µA. Inductor 230 provides an inductance of about 20 pH, at about 4.2° K. As is known in the art, to obtain higher inductance values, the geometric shape of inductor 330 must be changed. Thus, the so-called $\beta_L$ value can be estimated with Equation (1):

$$\beta_L = (Ic \times L)/\Phi_0 = 100 \text{ µA} \times 20 \text{ pH}/\Phi_0 \approx 1 \quad (1)$$

Figure 3A:
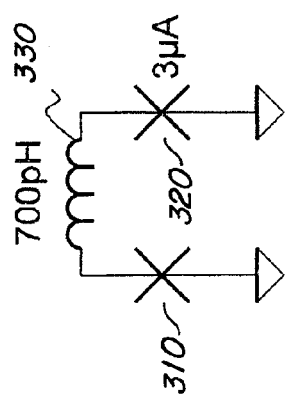
FIG. 3A is a circuit schematic for the conventional JTL loop with decreased Josephson junction critical current and proportionate increased loop inductance for performance at lower operating temperature.

FIG. 3A is a circuit schematic for a conventional JTL loop with decreased Josephson junction critical current and proportionate increased loop inductance for performance at lower operating temperature. As in FIG. 3A, Josephson junctions 310 and 320 are connected by inductor 330. To obtain the desired inductance, a significantly larger inductor 330 is used. The circuit of FIG. 3A is designed to operate at the milli-Kelvin range.

Figure 3B:
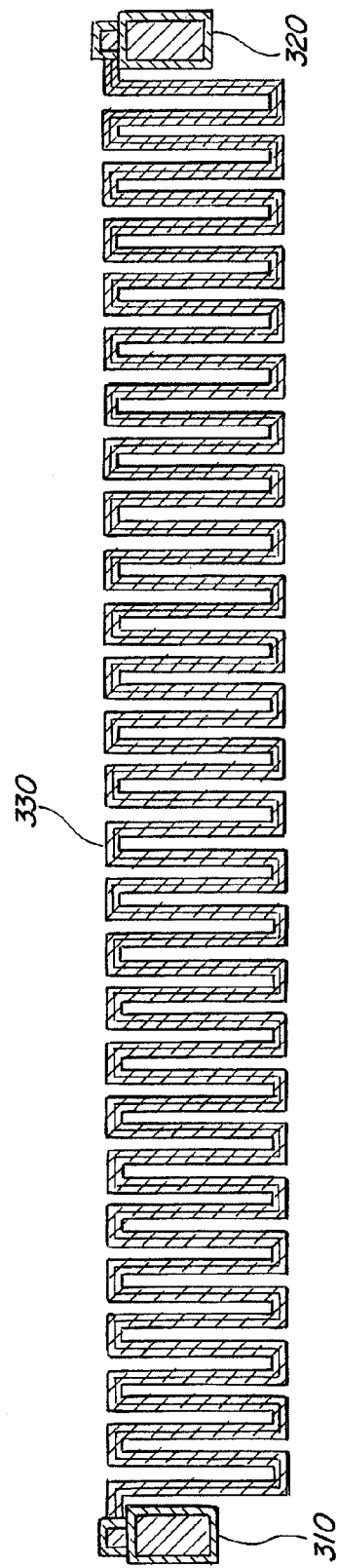
FIG. 3B shows a conventional JTL loop physical layout (magnified) with increased loop inductance for performance at lower operating temperature.

FIG. 3B is equivalent circuit representation for the SFQ logic device of FIG. 3A. At 10-100 mK, loop inductance of logic circuit of FIG. 3A is about 700 pH. In FIG. 3B, Josephson junctions 310 and 320 are coupled together through inductive circuit 330. Inductive circuit 330 provides about 700 pH of inductance which corresponds to about 700 geometric inductance squares. This is a rather large inductance footprint occupying a substantial area on the chip. As in the circuit of FIGS. 3A and 3B, the $\beta_L$ value can be estimated as:

$$\beta_L = (Ic \times L)/\Phi_0 = 3 \text{ µA} \times 700 \text{ pH}/\Phi_0 \approx 1 \quad (2)$$

It can be seen that the $\beta_L$ values from equations (1) and (2) are to be kept relatively close. However, the inductor size of the circuit of FIG. 3A is substantially larger than that of FIG. 2A.

FIG. 4A is a circuit schematic for an improved JTL loop according to an embodiment of the disclosure. In the embodiment of FIG. 4A, the geometric inductance is replaced with one or more Josephson inductance. Replacing the geometric inductance with the Josephson inductance provided the unexpected result of providing the same $\beta_L$ regardless of the designed operating temperature. In other words, the same physical layout applies to 4.2° K as in the 10-100 mK range. Moreover, the geometric size and footprint is invariant with respect to temperature.

FIG. 4B shows the JTL Loop physical layout according to an embodiment of the disclosure. As stated with regard to FIG. 4A, this implementation is scale-invariant. That is, the design applies equally well to all operating temperatures.

Referring again to FIG. 4A, junction 410 represents a first Josephson junction having a first critical current ($I_{c1}$). The critical current ($I_c$) of a Josephson junction is the current above which the Josephson junctions (and by extension, the SFQ logic circuit) fails to act as a superconductor, and becomes active, generating SFQ pulse. Junction 420 is the second Josephson junction having a second critical current ($I_{c2}$).

Josephson junctions 410 and 420 are separated by intermediate connectors 430-490. The intermediate Josephson junction connectors 430-490 are arranged in series. In one embodiment, the intermediate Josephson junction connectors are defined by larger junctions larger than the first Josephson junction 410 and/or the second Josephson junction 420. Thus, the critical current for the intermediate Josephson junction 430-490 can be higher than the first critical current ($I_{c1}$) and/or the second critical current ($I_{c2}$). In this manner, even though current flows through each intermediate junction, it does not exceed the junction's critical current thereby allowing the intermediate junction to operate as a superconductor.

The intermediate junction connectors 430-490 may be equal to or smaller than Josephson junctions 410 and 420, so long as the signal current does not exceed the critical current of the intermediate junctions. This is possible because the current can be arranged such that junctions 410 and 420 get bias current, whereas the intermediate junctions do not.

In another embodiment of the disclosure, at least one of the intermediate junctions 530-570 comprises a pair of Josephson junctions. The Josephson junction pair can be organized as a two junction SQUID, whose inductance is determined by means of a contral line. For example, intermediary junction 530 can comprise a pair of Josephson junctions connected in parallel.

According to one embodiment, the first Josephson junction and the second Josephson junction are connected by intermediary Josephson junctions having the same relative size and critical current as the first and/or the second intermediary Josephson junctions. In a preferred implementation, current is limited through the intermediary Josephson junctions such that it remains below the first critical current and/or the second critical current.

As stated, one advantage of the embodiments disclosed herein is the ability to limit the size of the geometric inductance using Josephson junctions. That is, the circuit is scale-invariant with respect to junction critical current and operating temperature. The representative embodiment of FIG. 5 provides this advantage by using a plurality of intermediary Josephson junctions which require a substantially smaller footprint as compared to the traditional inductive circuits.

The disclosed inductive circuits can be used as a component of a larger circuit. The disclosed inductive circuits is substantially smaller than the equivalent conventional circuits. The disclosed inductive circuits can be used in any temperature range. However, the superconductivity of Josephson junctions require a temperature below the critical temperature of the device. In a preferred embodiment, the operating temperature is in the milli-Kelvin range.

Figure 5A:
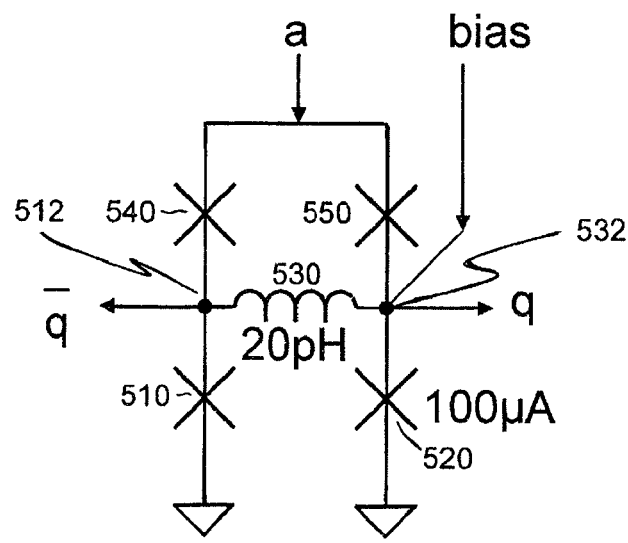
FIG. 5A is a circuit schematic for a conventional logical gate (i.e. T flip flop)
Figure 5B:
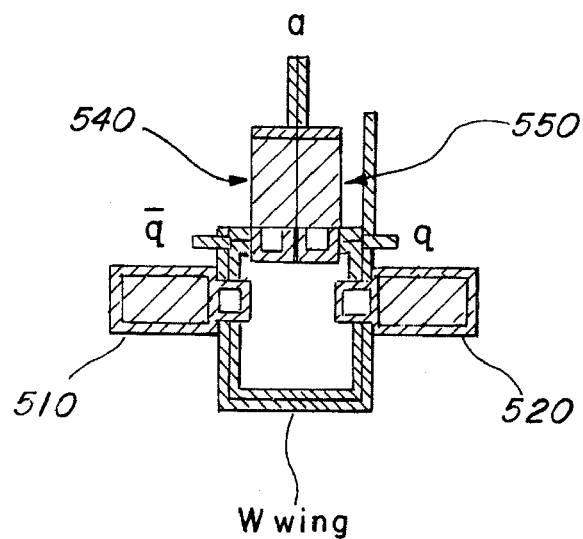
FIG. 5B shows physical layout (magnified) of a conventional logic gate.

FIGS. 5-7 show application of the disclosed embodiments to various circuits. Specifically, FIG. 5A shows a circuit schematic for a prior art logic gate T-type flip flop and FIG. 5B shows the physical layout of the logic gate of FIG. 5A. A t-type flip flop changes its output for each clock edge, giving an output which is half of the frequency signal of the T input. Referring to FIG. 5A, Josephson junctions 510 and 520 are coupled through inductor 530. Josephson junction 520 has a critical current of about 100 μA and is coupled to inductor 530 which has 20 pH inductance. A bias is applied to junction 532. Josephson junctions 540 and 550 form the balance of the T-Flip flop circuit.

Figure 6A:
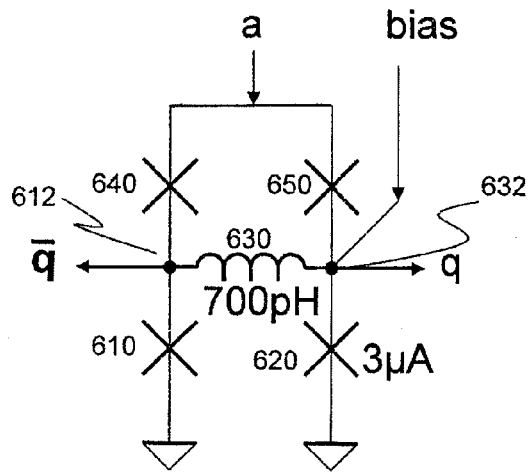
FIG. 6A is a circuit schematic for a conventional logic gate (T flip flop) with increased loop inductance for performance at lower operating temperature.
Figure 6B:
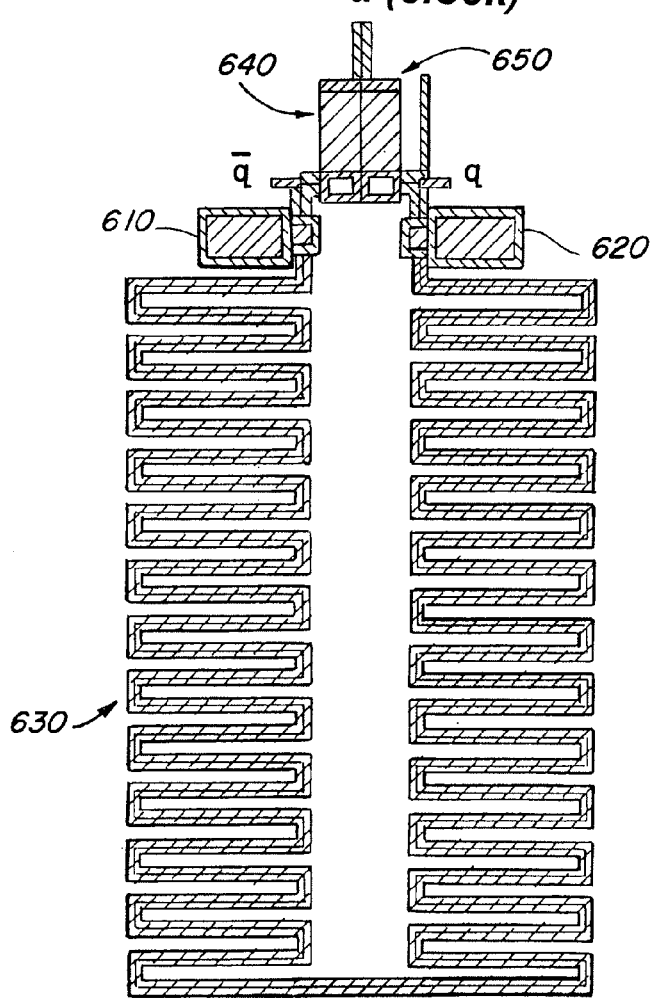
FIG. 6B shows physical layout (magnified) of the conventional logic gate with increased loop inductance for performance at lower operating temperature.

FIG. 6A is a circuit schematic for a conventional logic gate (T-type flip flop) with increased loop inductance for performance at lower operating temperature. FIG. 6B shows the physical layout of the logic gate of FIG. 6B. In FIG. 6A, Josephson junctions 610 and 620 are connected via inductor 630. Josephson junction 620 has a critical current of about 3 μA and inductor 630 has an inductance of about 700 pH. The increased inductance value is calculated to allow operating at a much lower temperature. The physical dimensions of inductor 630 is represented in FIG. 6B. While the increased loop inductance 630 of FIG. 6B allows performance at lower operating temperature, the increased dimensions consume more chip area.

Figure 7A:
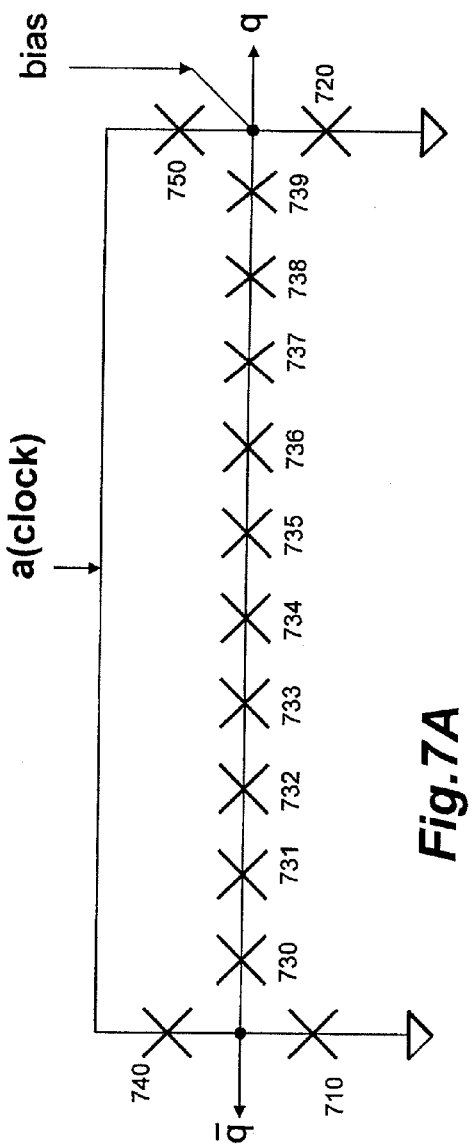
FIG. 7A is a circuit schematic for the logic gate according to an embodiment of the disclosure.
Figure 7B:
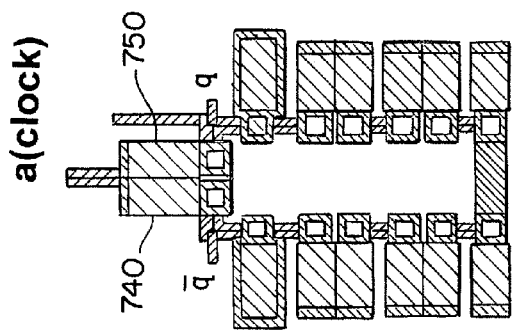
FIG. 7B shows the logic gate physical layout (magnified) according to an embodiment of the disclosure.

FIG. 7A is a circuit schematic for the logic gate according to one embodiment of the disclosure. In the embodiment of FIG. 7A, Josephson junctions 710 and 720 are coupled through Josephson junctions 730. Josephson junctions 730 replace inductive circuit 630 in FIG. 6A. FIG. 7B shows the logic gate physical layout for the embodiment of FIG. 7A. In FIG. 7B, Josephson junctions 710 and 720 are connected through a plurality of Josephson junctions 730. As can be seen from FIGS. 7A and 7B, the circuit of FIG. 7B is substantially more compact and space efficient than that of FIG. 6B. Thus, the inventive embodiments provided herein are advantageous in promoting chip efficiency. The disclosed principles are equally applicable to all other SFQ gates, all of which typically have inductive loops.

While the specification has been disclosed in relation to the exemplary embodiments provided herein, it is noted that the inventive principles are not limited to these embodiments and include other permutations and deviations without departing from the spirit of the disclosure.

We claim:

1. A single flux quantum digital logic circuit comprising:
   a first Josephson junction having a first critical current ($I_{c1}$);
   a second Josephson junction having a second critical current ($I_{c2}$);
   a series of intermediate Josephson junctions interposed between the first Josephson junction and the second Josephson junction, the series of intermediate Josephson junctions receiving a working current from the first Josephson junction and directing the working current to the second Josephson junction;
   wherein the working current has a magnitude that is sufficient to create a desirable signal to the second Josephson junction while sufficiently low to not disturb super-conductivity of the series of intermediate Josephson junctions.

2. The circuit of claim 1, wherein the working current value is equal or less than one of the first critical current $I_{c1}$ and the second critical current $I_{c2}$.

3. The circuit of claim 1, wherein the working current value is equal or less than the first critical current $I_{c1}$ and the second critical current $I_{c2}$.

4. The circuit of claim 1, wherein the series of intermediate Josephson junctions have substantially no resistance at the working current.

5. The circuit of claim 1, wherein the series of intermediate Josephson junctions further comprise at least one Josephson junction.

6. The circuit of claim 1, wherein the series of intermediate Josephson junctions further comprises a plurality of Josephson junctions connected in series.

7. The circuit of claim 1, wherein the product of the Josephson junction critical current and the inductance through the series of intermediate Josephson junctions remains constant as the designed value of the critical current changes.

8. A method for conducting a logic circuit, the method comprising:
   arranging a series of Josephson junctions between a first Josephson junction and a second Josephson junction, the first Josephson junction having a first critical current ($I_{c1}$) and the second Josephson junction having a second critical current ($I_{c2}$);
   providing a working current to the first Josephson junction, the working current transmitting to the second Josephson junction through the series of the Josephson junctions;
   wherein the working current has a magnitude that is sufficient to create a desirable signal at the second Josephson junction while sufficiently low to not disturb super-conductivity of the series of intermediate Josephson junctions.

9. The method of claim 8, wherein the series of Josephson junctions is connected in series with the first Josephson junction and the second Josephson junction.

10. The method of claim 8, wherein the working current has a value equal or less than one of the first critical current $I_{c1}$ and the second critical current $I_{c2}$.

11. The method of claim 8, wherein the working current value is equal or less than the first critical current $I_{c1}$ and the second critical current $I_{c2}$.

12. The method of claim 8, wherein the series of intermediate Josephson junctions have substantially no resistance at the working current.

13. The method of claim 8, wherein the series of intermediate Josephson junctions further comprise at least one Josephson junction.

14. The method of claim 8, wherein the series of intermediate Josephson junctions further comprise a plurality of Josephson junctions connected in series.

15. The method of claim 8, wherein the product of the critical current and the inductance in the series of Josephson junctions remains constant as the designed value of the critical current changes.

16. The circuit of claim 1, wherein each of the series of intermediate Josephson junctions has a physical size that is larger than each of the first Josephson junction and the second Josephson junction.

17. The circuit of claim 1, further comprising a current source configured to provide a bias current to the first Josephson junction and the second Josephson junction, wherein each of the series of intermediate Josephson junctions has a physical size that is smaller than each of the first Josephson junction and the second Josephson junction.

18. The circuit of claim 1, wherein at least one of the series of intermediate Josephson junctions is configured as a two junction superconducting quantum interference device (SQUID) having an inductance that is set by a control signal.

19. The method of claim 8, wherein arranging the series of Josephson junctions comprises arranging each of the series of Josephson junctions to have a physical size that is larger than each of the first Josephson junction and the second Josephson junction.

20. The method of claim 8, further comprising providing a bias current to the first Josephson junction and the second Josephson junction, wherein arranging the series of Josephson junctions comprises arranging each of the series of Josephson junctions to have a physical size that is smaller than each of the first Josephson junction and the second Josephson junction.

* * * * *